United States Patent
Takahashi et al.

(10) Patent No.: US 8,482,999 B2
(45) Date of Patent: Jul. 9, 2013

(54) SEMICONDUCTOR MEMORY INTEGRATED DEVICE HAVING A PRECHARGE CIRCUIT WITH THIN-FILM TRANSISTORS GATED BY A VOLTAGE HIGHER THAN A POWER SUPPLY VOLTAGE

(75) Inventors: Hiroyuki Takahashi, Kanagawa (JP); Tetsuo Fukushi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/600,412

(22) Filed: Aug. 31, 2012

(65) Prior Publication Data
US 2012/0327732 A1    Dec. 27, 2012

Related U.S. Application Data

(63) Continuation of application No. 12/769,141, filed on Apr. 28, 2010, now Pat. No. 8,279,691.

(30) Foreign Application Priority Data
May 14, 2009   (JP) .................................. 2009-117889

(51) Int. Cl.
*G11C 7/12*   (2006.01)
(52) U.S. Cl.
USPC ........... 365/203; 365/202; 365/190; 365/227; 365/228
(58) Field of Classification Search
USPC ................. 365/227, 228, 226, 203, 202, 190, 365/208, 207
See application file for complete search history.

(56) References Cited

U.S. PATENT DOCUMENTS

| | | | |
|---|---|---|---|
| 5,212,663 | A | 5/1993 | Leong |
| 6,215,159 | B1 | 4/2001 | Fujita et al. |
| 6,424,015 | B1 | 7/2002 | Ishibashi et al. |
| 6,563,180 | B2 | 5/2003 | Ishibashi et al. |
| 6,683,353 | B2 | 1/2004 | Ishibashi et al. |
| 6,795,358 | B2 | 9/2004 | Tanaka et al. |
| 6,953,975 | B2 | 10/2005 | Ishibashi et al. |
| 6,977,856 | B2 | 12/2005 | Tanaka et al. |

(Continued)

FOREIGN PATENT DOCUMENTS

| | | |
|---|---|---|
| JP | 11-185467 A | 7/1999 |
| JP | 2001-15704 A | 1/2001 |

(Continued)

OTHER PUBLICATIONS

USPTO, Notice of Allowance, U.S. Appl. No. 12/769,141, Jun. 7, 2012.

*Primary Examiner* — Andrew Q Tran
(74) *Attorney, Agent, or Firm* — Foley & Lardner LLP

(57) ABSTRACT

Provided is a semiconductor integrated device including a semiconductor memory circuit and a peripheral circuit of the semiconductor memory circuit. The peripheral circuit includes a first transistor having a first voltage as a breakdown voltage of a gate oxide film. The semiconductor memory circuit includes a pair of bit lines, one of the pair of bit lines being connected to a gate transistor of a memory cell, and a precharge circuit that includes a transistor having a breakdown voltage substantially equal to that of the first transistor, and precharges the pair of bit lines to a predetermined voltage in response to an activation signal. The activation signal of the precharge circuit is a second voltage higher than the first voltage.

7 Claims, 13 Drawing Sheets

| U.S. PATENT DOCUMENTS | | | | FOREIGN PATENT DOCUMENTS | | |
|---|---|---|---|---|---|---|
| 7,177,215 B2 | 2/2007 | Tanaka et al. | | JP | 2003-132679 A | 5/2003 |
| 7,193,912 B2 | 3/2007 | Obara et al. | | JP | 2004-087074 A | 3/2004 |
| 7,408,231 B2 | 8/2008 | Ishibashi et al. | | JP | 2005-340367 A | 12/2005 |
| 7,440,350 B2 | 10/2008 | Obara et al. | | JP | 2010-267328 A | 11/2010 |
| 8,279,691 B2 * | 10/2012 | Takahashi et al. | 365/203 | | | |
| 2009/0010042 A1 | 1/2009 | Ishibashi et al. | | * cited by examiner | | |

|  | SEMICONDUCTOR MEMORY CIRCUIT 1 (RELATED ART) | | TECHNIQUE FEASIBLE IN JPATENT DOCUMENT 1 | | SEMICONDUCTOR MEMORY CIRCUIT 100 (EXEMPLARY EMBODIMENT 1) | |
|---|---|---|---|---|---|---|
|  | TYPE OF TRANSISTOR | MAX GATE VOLTAGE | TYPE OF TRANSISTOR | MAX GATE VOLTAGE | TYPE OF TRANSISTOR | MAX GATE VOLTAGE |
| GATE TRANSISTOR OF MEMORY CELL | THICK-FILM TRANSISTOR | VPP | THICK-FILM TRANSISTOR | VPP | THICK-FILM TRANSISTOR | VPP |
| GATE TRANSISTOR OF SENSE AMPLIFIER | THICK-FILM TRANSISTOR | VDD | THIN-FILM TRANSISTOR | VDD | THIN-FILM TRANSISTOR | VDD |
| GATE TRANSISTOR OF PRECHARGE CIRCUIT | THICK-FILM TRANSISTOR | VPDL | THIN-FILM TRANSISTOR | ABOUT VDD | THIN-FILM TRANSISTOR | VPP |

Fig. 6

| | Semiconductor Memory Circuit 1 (Related Art) | | Technique Feasible in JPatent Document 1 | | Semiconductor Memory Circuit 100 (Exemplary Embodiment 1) | | Semiconductor Memory Circuit 200 (Exemplary Embodiment 2) | |
|---|---|---|---|---|---|---|---|---|
| | Type of Transistor | Max Gate Voltage | Type of Transistor | Max Gate Voltage | Type of Transistor | Max Gate Voltage | Type of Transistor | Max Gate Voltage |
| Gate Transistor of Memory Cell | Thick-Film Transistor | VPP | Thick-Film Transistor | VPP | Thick-Film Transistor | VPP | Thin-Film Transistor | VPPL |
| Gate Transistor of Sense Amplifier | Thick-Film Transistor | VDD | Thin-Film Transistor | VDD | Thin-Film Transistor | VDD | Thin-Film Transistor | VDD |
| Gate Transistor of Precharge Circuit | Thick-Film Transistor | VPDL | Thin-Film Transistor | VDD | Thin-Film Transistor | VPP | Thin-Film Transistor | VPPL |

Fig. 11

SEMICONDUCTOR MEMORY INTEGRATED DEVICE HAVING A PRECHARGE CIRCUIT WITH THIN-FILM TRANSISTORS GATED BY A VOLTAGE HIGHER THAN A POWER SUPPLY VOLTAGE

INCORPORATION BY REFERENCE

This application is a continuation of U.S. patent application Ser. No. 12/769,141, filed on Apr. 28, 2010, which claims the benefit of priority from Japanese patent application No. 2009-117889, filed on May 14, 2009, the disclosure of which is incorporated herein in its entirety by reference.

BACKGROUND OF THE INVENTION

1. Field of the Invention

The present invention relates to a semiconductor integrated device.

2. Description of Related Art

FIG. 12 shows a semiconductor memory circuit 1 according to a related art. As shown in FIG. 12, the semiconductor memory circuit 1 includes a cell array area 2, a sense amplifier area 3, and a driver area 4.

The cell array area 2 includes multiple memory cells (CELL1, CELL2, ... ).

Each memory cell is connected to one of a pair of bit lines D and DB. Each memory cell includes a gate transistor Tr and a cell capacitor Ccell. One of the drain and source of the gate transistor Tr is connected to one of the pair of bit lines D and DB. The other of the drain and source of the gate transistor Tr is connected to the cell capacitor Ccell. A node between the gate transistor Tr and the cell capacitor Ccell serves as a cell node. A terminal of the cell capacitor Ccell on the opposite side of the cell node is connected to an HVDD terminal. The HVDD terminal is supplied with a voltage 1/2VDD (VDD: power supply voltage). The gate of the gate transistor Tr is connected to a word line WL (WL1, WL2, ... ).

The sense amplifier area 3 includes a sense amplifier SA1 and a precharge circuit PDLU1.

The sense amplifier SA1 includes PMOS transistors TP11 and TP12 and NMOS transistors TN11 and TN12. The PMOS transistor TP11 and the NMOS transistor TN11 are connected in series between sense amplifier control lines SAP and SAN. The PMOS transistor TP12 and the NMOS transistor TN12 are also connected in series between the sense amplifier control lines SAP and SAN. A connection node A1 between the PMOS transistor TP11 and the NMOS transistor TN11 is connected to the bit line D and the gates of the PMOS transistor TP12 and the NMOS transistor TN12. A connection node A2 between the PMOS transistor TP12 and the NMOS transistor TN12 is connected to the bit line DB and the gates of the PMOS transistor TP11 and the NMOS transistor TN11.

The precharge circuit PDLU1 includes NMOS transistors TN21, TN22, and TN23. The NMOS transistor TN21 is connected between the pair of bit lines D and DB. The NMOS transistor TN22 is connected to the HVDD terminal and the bit line D. The NMOS transistor TN23 is connected to the HVDD terminal and the bit line DB. The gates of the NMOS transistors TN21, TN22, and TN23 are each connected to a precharge control line PDL. For convenience of description, reference symbols "WL", "SAP", "SAN", and "PDL" each represent a line name as well as a name of a signal to be applied to the line.

The driver area 4 includes driver amplifiers AMP1, AMP2, .... The driver area 4 further includes driver amplifiers AMP11, AMP12, and AMP20. The amplifiers AMP1, AMP2 ... apply word signals WL1, WL2, ... to word lines WL1, WL2, ..., respectively. A power supply voltage of each of the driver amplifiers AMP1, AMP2, ... is supplied from a VPP power supply 10. A voltage VPP supplied from the VPP power supply 10 has a potential higher than the power supply voltage VDD.

The driver amplifiers AMP11 and AMP12 apply sense amplifier signals SAP and SAN to the sense amplifier control lines SAP and SAN, respectively, in response to a control signal SE. A power supply voltage of the amplifier AMP11 is supplied from a VDD power supply 20. The VDD power supply 20 supplies a power supply voltage VDD. Note that the driver amplifier AMP12 supplies a ground voltage GND to the sense amplifier control line SAN in response to the control signal SE.

The driver amplifier AMP20 applies a precharge control signal PDL to the precharge control line PDL. A power supply voltage of the driver amplifier AMP20 is supplied from a VPDL power supply 30. A voltage VPDL supplied from the VPDL power supply 30 has a potential higher than the power supply voltage VDD. The reasons for setting the voltage VPDL higher than the power supply voltage VDD are as follows. First, as described above, the precharge voltage of the pair of bit lines D and DB is 1/2VDD. If the potential of the precharge control signal PDL of high level is set as the power supply voltage VDD, a potential difference between the gate and drain (or source) is about 1/2VDD. Thus, there is a possibility that the NMOS transistors TN21 to TN23 are not activated rapidly and sufficiently. Such a phenomenon is remarkable particularly when the power supply voltage VDD is further reduced. Therefore, in order to increase the operation speed of the precharge circuit, it is necessary to apply a voltage having a potential higher than that of the power supply voltage VDD (e.g., about VDD+0.5 V) to the gates of the NMOS transistors TN21 to TN23.

Herein, a transistor having a gate oxide film thickness with a breakdown voltage within the range of the normal power supply voltage VDD is referred to as a thin-film transistor, and a transistor having a gate oxide film with a thickness greater than the gate oxide film thickness of the thin-film transistor is referred to as a thick-film transistor. Referring to FIG. 12, in the semiconductor memory circuit 1 of the related art, thick-film transistors are used as the constituent transistors. Each thick-film transistor has a relatively high breakdown voltage characteristic (e.g., 1.5 V or higher). In this case, however, transistors having a larger gate oxide film thickness require a longer channel length, which cases a problem of an increase in layout area of thick-film transistors.

FIG. 13 shows a timing diagram illustrating operation of the semiconductor memory circuit 1. This exemplary embodiment shows the case where the memory cell CELL1 holding high-level information is selected and the information is read out to the bit lines. Additionally, it is assumed that the pair of bit lines D and DB are precharged to the voltage 1/2VDD.

Referring to FIG. 13, at a time t1, the word signal WL1 rises to the voltage VPP. At this time, the memory cell CELL1 holds the high-level information. Accordingly, the potential of the bit line D slightly increases. At a time t2, the control signal SE becomes high level. Further, the sense amplifier control signal SAP becomes equal to the power supply voltage VDD, and the sense amplifier control signal SAN becomes equal to the ground voltage GND. Thus, the sense amplifier SA1 starts sensing operation and amplifies a potential difference between the pair of bit lines D and DB to the power supply voltage VDD and to the ground voltage GND.

Then, the amplified potential difference between the pair of bit lines D and DB is read out to an external circuit.

After that, at a time t3, the word signal WL1 falls to the ground voltage GND. Accordingly, the cell node of the memory cell CELL1 and the bit line D are electrically disconnected from each other. The control signal SE also falls to the ground voltage GND. As a result, the sense amplifier SA1 stops the sensing operation. Then, at a time t4, the precharge control signal PDL rises to the voltage VPDL, and the pair of bit lines D and DB are precharged again to the voltage 1/2VDD. The semiconductor memory circuit 1 of the related art operates in the manner as described above.

In recent years, there is a demand for higher levels of integration and higher performance of semiconductor integrated devices such as system LSIs. Along with the demand, the miniaturization in fabrication process for semiconductor integrated devices has advanced, and the power supply voltage has been reduced in potential. In such system LSIs, a logic circuit and a memory circuit such as a DRAM coexist. Therefore, a circuit, such as the semiconductor memory circuit 1, and a logic circuit that operates at high speed are integrated into one chip. For this reason, there is a demand for higher speed operation and higher levels of integration of the semiconductor memory circuit 1. Along with the reduction in chip area and the higher speed operation, the gate oxide film of each transistor constituting the semiconductor memory circuit 1 has been reduced in thickness.

In this case, the NMOS transistors TP11, TP12, TN11, and TN12, which constitute the sense amplifier SA1, require a breakdown voltage of about the power supply voltage VDD at a maximum. Accordingly, thin-film transistors having a low breakdown voltage corresponding to the reduced power supply voltage can be used as the MOS transistors TP11, TP12, TN11, and TN12. However, as described above, the high potential VPP is applied to the gate of the gate transistor Tr of each memory cell. It is difficult to reduce the thickness of the gate oxide film of the gate transistor Tr, and thus a thin-film transistor having a relatively thick gate oxide film must be used.

Additionally, the system LSI incorporating the semiconductor memory circuit 1 includes a logic circuit as a peripheral circuit of the semiconductor memory circuit 1 as described above. The logic circuit performs logic processing using data held in the semiconductor memory circuit 1. The logic circuit requires high-speed operation, and thus the most thinned transistors are used in a semiconductor integrated device such as a system LSI. Japanese Unexamined Patent Application Publication No. 2001-15704 (hereinafter referred to as "Patent Document 1") discloses a technique in which transistors formed of gate oxide films having different thicknesses are used in one semiconductor integrated device, as with the system LSI.

SUMMARY OF THE INVENTION

The present inventors have found a problem as described below. In the technique disclosed in Patent Document 1, a thick-film transistor is used as a central transistor of a memory cell, and a thin-film transistor, which is used for a logic circuit, is used as a precharge MOS transistor and a sense amplifier. Patent Document 1 discloses that a high voltage is not applied to the precharge MOS transistor which is formed of a thin-film transistor. However, unless a voltage higher than the power supply voltage as in the semiconductor memory circuit 1 is applied to the transistor for use in the precharge circuit, the operation speed of the precharge circuit cannot be increased. Accordingly, the present inventors have found a problem that the semiconductor integrated device fabricated using the technique as disclosed in Patent Document 1 has a limitation in achieving a higher speed operation.

A first exemplary aspect of the present invention is a semiconductor integrated circuit including a semiconductor memory circuit and a peripheral circuit of the semiconductor memory circuit. The peripheral circuit includes a first transistor having a first voltage as a breakdown voltage of a gate oxide film. The semiconductor memory circuit includes a pair of bit lines, one of the pair of bit lines being connected to a gate transistor of a memory cell, and a precharge circuit that includes a transistor having a breakdown voltage substantially equal to that of the first transistor, and precharges the pair of bit lines to a predetermined voltage in response to an activation signal. The activation signal of the precharge circuit is a second voltage higher than the first voltage.

In the semiconductor integrated device according to the first exemplary aspect of the present invention, the transistor which is used in the peripheral circuit, such as a logic circuit, and which has a breakdown voltage substantially equal to that of the first transistor having the breakdown voltage of the first voltage is used as the precharge circuit. The second voltage higher than the first voltage is used as the activation signal of the precharge circuit, to thereby achieve a high-speed operation of the precharge circuit.

The semiconductor integrated device according to an exemplary aspect of the present invention achieves a high-speed operation.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 6 is a table showing differences between a related art and the semiconductor memory circuit according to the first exemplary embodiment;

FIG. 11 is a table showing differences between the related art and the semiconductor memory circuits according to the first and second exemplary embodiments;

DETAILED DESCRIPTION OF THE EXEMPLARY EMBODIMENTS

[First Exemplary Embodiment]

Figure 1:
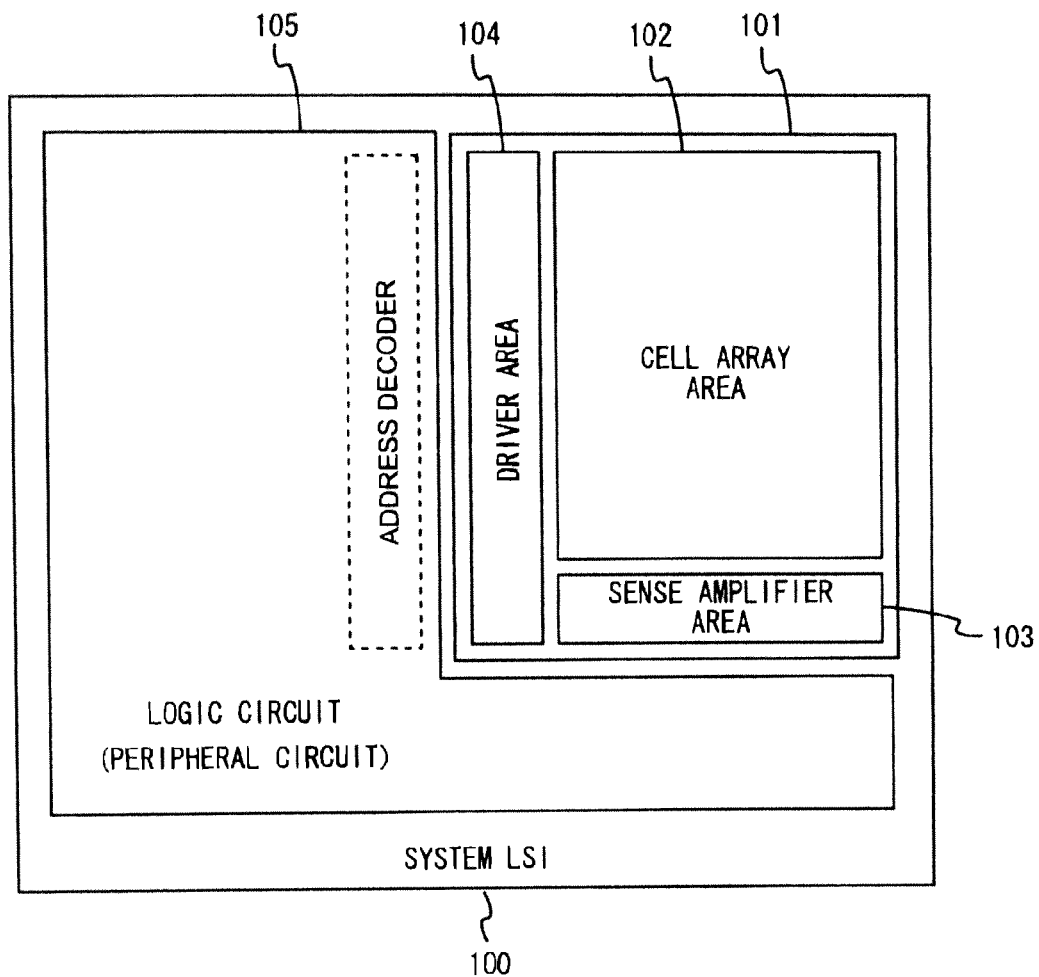
FIG. 1 shows a semiconductor integrated device according to a first exemplary embodiment of the present invention.

A first exemplary embodiment of the present invention will he described in detail below with reference to the accompanying drawings. In the first exemplary embodiment, the present invention is applied to a semiconductor integrated device 100 such as a system LSI. FIG. 1 shows a schematic diagram of a system LSI chip of the semiconductor integrated device 100. As shown in FIG. 1, the semiconductor integrated device 100 includes a semiconductor memory circuit 101 and a logic circuit 105.

The logic circuit 105 includes, integrated therein, a control circuit, such as a CPU of the semiconductor integrated device 100, and a logic gate for performing logic operation, such as an address decoder of the semiconductor memory circuit 101. The semiconductor integrated device 100, such as a system LSI, is required to have a high performance. For this reason, the logic gate constituting the logic circuit 105 is required to execute a logic operation at high speed. Therefore, in the logic circuit 105, the miniaturization in fabrication process of transistors constituting the logic gate advances so that the logic gate can operate at as high a speed as possible. In the process of miniaturization, the gate oxide film of each transistor is thinned. Also in the semiconductor integrated device 100, transistors constituting the logic circuit 105 are most miniaturized and reduced in film thickness.

Along with the reduction in thickness of the gate oxide film, the breakdown voltage of the transistors is lowered as a matter of course. Accordingly, the operating voltage of the logic gate must be lowered, so a power supply voltage VDD is further lowered. For this reason, the power supply voltage VDD of the logic circuit 105 is reduced to 1.0 V or lower, for example.

In the following description, unless otherwise stated, it is assumed that the power supply voltage VDD according to the first exemplary embodiment is equal to a reduced power supply voltage (e.g., 1.0 V or lower) for use in the logic circuit 105. Further, a transistor including a gate oxide film having a breakdown voltage of about the reduced power supply voltage VDD, such as a reduced power supply voltage used in the logic circuit 105, is referred to as a thin-film transistor. Meanwhile, a transistor having a breakdown voltage which is higher than the power supply voltage VDD is required to have a gate oxide film thicker than that of the thin-film transistor. Such a transistor is referred to as a thick-film transistor.

Figure 2:
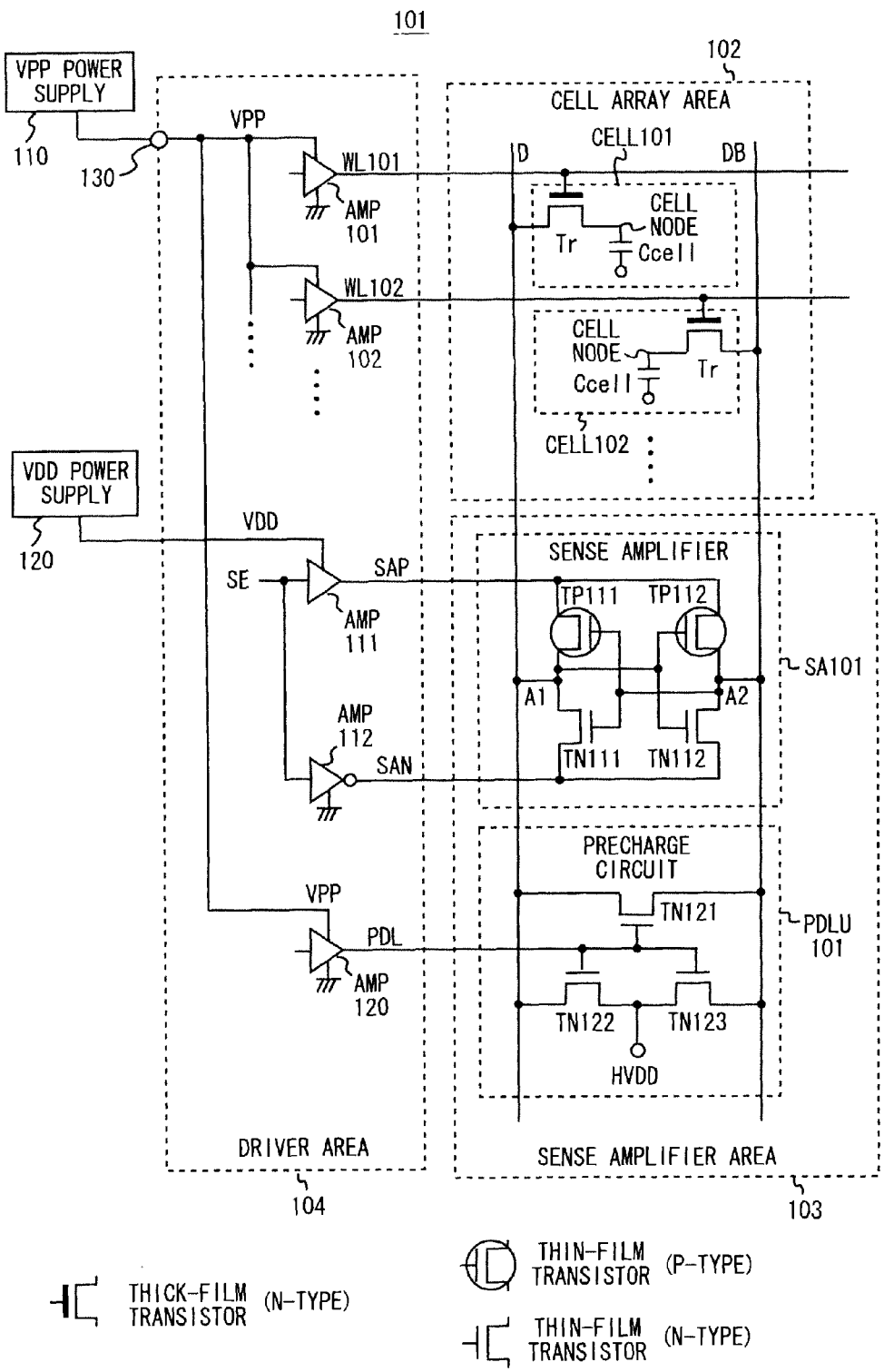
FIG. 2 shows a semiconductor memory circuit according to the first exemplary embodiment.

The semiconductor memory circuit 101 is a built-in DRAM of the semiconductor integrated device 100. The semiconductor memory circuit 101 holds data or the like to be processed in the logic circuit 105. As shown in FIG. 1, the semiconductor memory circuit 101 includes a cell array area 102, a sense amplifier area 103, and a driver area 104. FIG. 2 shows an exemplary circuit configuration of the semiconductor memory circuit 101. In the first exemplary embodiment, the semiconductor memory circuit 101 shown in FIG. 2 is illustrated as a DRAM circuit including a pair of bit lines in order to simplify the drawings. The semiconductor memory circuit 101 may have a configuration including multiple pairs of bit lines, memory cells connected to the multiple pairs of bit lines, a sense amplifier, and a precharge circuit. Further, the semiconductor memory circuit 101 is not limited to a DRAM, but may be an SRAM, for example.

The cell array area 102 includes multiple memory cells CELLs (CELL101, CELL102, . . . ).

Each memory cell is connected to one of a pair of bit lines D and DB. Each memory cell includes a gate transistor Tr and a cell capacitor Ccell. One of the drain and source of the gate transistor Tr is connected to one of the pair of bit lines D and DB. The other of the drain and source of the gate transistor Tr is connected to the cell capacitor Ccell. A node between the gate transistor Tr and the cell capacitor Ccell serves as a cell node. A terminal of the cell capacitor Ccell on the opposite side of the cell node is connected to an HVDD terminal. The HVDD terminal is supplied with a voltage 1/2VDD (VDD: power supply voltage). The gate of each gate transistors Tr is connected to a word line WL (WL101, WL102, . . . ). For convenience of description, reference symbols "WL101", "WL102", . . . each represent a word line name as well as a name of a word line signal to be applied to the word line.

For example, when a word signal WL101 becomes high level, the gate transistor of the memory cell CELL101 is turned on, and the cell node and the bit line D are electrically connected to each other. When a word signal WL102 becomes high level, the gate transistor of the memory cell CELL102 is turned on, and the cell node and the bit line DB are electrically connected to each other. Note that when one of the word signals WL101, WL102, . . . is selected and becomes high level, all the other word lines become low level. Accordingly, when a word signal of a selected word signal line becomes high level, information held in a memory cell connected to the word signal line is read out to the bit line. The other memory cells are not selected. As described later, each word signal at high level serves as a voltage VPP which is higher than the power supply voltage VDD. This is intended to increase the activation speed of each gate transistor and to reduce an ON-resistance. Accordingly, each gate transistor Tr is required to have a high breakdown voltage, so each gate transistor Tr is formed of a thick-film transistor.

The sense amplifier area 103 includes a sense amplifier SA101 and a precharge circuit PDLU101.

The sense amplifier SA101 includes PMOS transistors TP111 and TP112 and NMOS transistors TN111 and TN112. The PMOS transistor TP111 and the NMOS transistor TN111 are connected in series between sense amplifier control lines SAP and SAN. The PMOS transistor TP112 and the NMOS transistor TN112 are also connected in series between the sense amplifier control lines SAP and SAN. A connection node Al between the PMOS transistor TP111 and the NMOS transistor TN111 is connected to the bit line D and the gates of the PMOS transistor TP112 and the NMOS transistor TN112. A connection node A2 between the PMOS transistor TP112 and the NMOS transistor TN112 is connected to the bit line DB and the gates of the PMOS transistor TP111 and the NMOS transistor TN111. For convenience of description, reference symbols "SAP" and "SAN" each represent a sense amplifier control line name as well as a name of a sense amplifier control signal to be applied to the sense amplifier control line. As described later, a sense amplifier control signal SAP obtained when a control signal SE is at high level serves as the power supply voltage VDD, and a sense amplifier control signal SAN serves as a ground voltage GND. Accordingly, the gate-drain (or source) voltage of each of the PMOS transistors TP111 and TP112 and the NMOS transistors TN111 and TN112 is about the power supply voltage VDD at a maximum. Thus, these transistors are each formed of a thin-film transistor having a breakdown voltage corresponding to about the reduced power supply voltage VDD.

The precharge circuit PDLU101 includes NMOS transistors TN121, TN122, and TN123. The NMOS transistor TN121 is connected between the pair of bit lines D and DB. The NMOS transistor TN122 is connected to the HVDD terminal and the bit line D. The NMOS transistor TN123 is connected to the HVDD terminal and the bit line DB. The gates of the NMOS transistors TN121, TN122, and TN123 are each connected to a precharge control line PDL. For convenience of description, reference symbol "PDL" represents a precharge control line name as well as a name of a precharge control signal to be applied to the precharge control line.

The driver area 104 includes driver amplifiers AMP101, AMP102, . . . . The driver area 104 further includes driver amplifiers AMP111, AMP112, and AMP120.

The driver amplifiers AMP101, AMP102, apply word signals WL101, WL102, . . . to the word lines WL101, WL102, . . . , respectively. A high-potential-side power supply voltage of each of the driver amplifiers AMP101, AMP102, . . . is supplied from a VPP power supply 110. Accordingly, high-potential-side power supply terminals of the driver amplifiers AMP101, AMP102, . . . are each connected to a terminal 130. Low-potential-side power supply voltage terminals thereof are each connected to a ground terminal GND. The voltage VPP supplied from the VPP power supply 110 has a potential higher than the power supply voltage VDD. For example, assuming that the voltage VPP is about 1.5 times as high as the power supply voltage VDD, when the power supply voltage VDD is 1.0 V, the voltage VPP is about 1.5 V, and when the power supply voltage VDD is 0.8 V, the voltage VPP is about 1.2 V.

The driver amplifiers AMP111 and AMP 112 apply the sense amplifier control signals SAP and SAN to the sense amplifier control lines SAP and SAN, respectively, in response to the control signal SE. A power supply voltage of the driver amplifier AMP111 is supplied from a VDD power supply 120. The VDD power supply 120 supplies the power supply voltage VDD. Note that the driver amplifier AMP112 supplies the ground voltage GND to the sense amplifier control line SAN in response to the control signal SE.

The driver amplifier AMP 120 applies a precharge control signal PDL to the precharge control line PDL. A high-potential-side power supply voltage of the driver amplifier AMP103 is supplied from the VPP power supply 110. Accordingly, the potential of the precharge control signal PDL at high level becomes equal to the voltage VPP. As with the driver amplifiers AMP101, AMP102, . . . , a power supply terminal of the driver amplifier AMP 120 is connected to the terminal 130, and a low-potential-side power supply voltage terminal thereof is connected to the ground terminal GND. Accordingly, the potential of the precharge control signal PDL at low level becomes equal to the ground potential GND. For convenience of description, reference symbols "VDD" and "GND" represent a power supply voltage and a ground voltage, respectively, and also represent terminal names.

Figure 3:
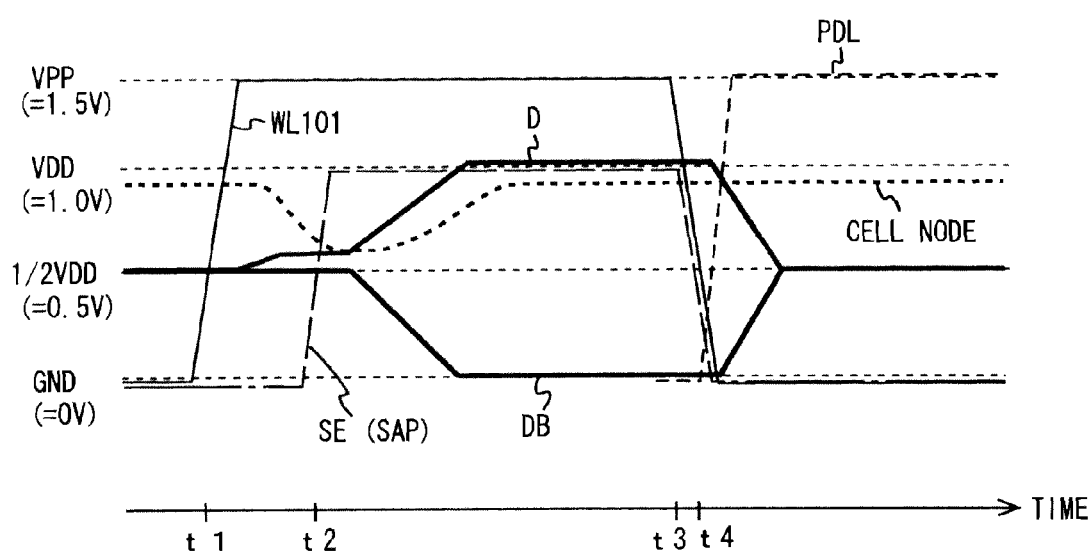
FIG. 3 is a timing diagram showing operation of the semiconductor memory circuit according to the first exemplary embodiment.

Referring now to FIG. 3 which is a timing diagram showing operation of the semiconductor memory circuit 101. This exemplary embodiment illustrates the case where the memory cell CELL101 which holds high-level information is selected, and the information is read out to the bit line D. It is assumed that, prior to a time t1, the pair of bit lines D and DB are precharged to the voltage 1/2VDD.

Referring to FIG. 3, at the time t1, the word signal WL101 rises to the voltage VPP from the ground voltage GND. Accordingly, the gate transistor of the memory cell CELL101 is turned on, and the cell node and the bit line D are electrically connected to each other. The cell node holds high-level data, and electric charges are transferred to the bit line D. Thus, the potential of the cell node decreases, while the potential of the bit line D slightly increases.

Next, at a time t2, the control signal SE becomes high level. Accordingly, the sense amplifier control signal SAP becomes equal to the power supply voltage VDD, and the sense amplifier control signal SAN becomes equal to the ground voltage GND. Then, the sense amplifier SA101 starts sensing operation. The sense amplifier SA101 amplifies a small potential difference between the pair of bit lines D and DB to the power supply voltage VDD and to the ground voltage GND. Note that the amplified potential difference between the pair of bit lines D and DB is read out as high-level readout data of the semiconductor memory circuit 10 by an external circuit, and is used for data processing and the like of the logic circuit 105. Additionally, the potential of the cell node of the memory cell CELL101 also increases.

After that, at a time t3, the word signal WL101 and the control signal SE fall to the ground voltage GND. Accordingly, the gate transistor of the memory cell CELL101 is turned off, and the cell node of the memory cell CELL101 and the bit line D are electrically disconnected from each other. Further, the sense amplifier SA101 stops the sensing operation.

Then, at a time t4, the precharge control signal PDL rises to the voltage VPP from the ground voltage GND. Accordingly, the NMOS transistors TN121, TN122, and TN123 of the precharge circuit PDLU101 are turned on. As a result, the pair of bit lines D and DB are equalized and charged to the voltage 1/2VDD, and are precharged again to the voltage 1/2VDD. The semiconductor memory circuit 101 operates in the manner as described above.

Figure 4A:
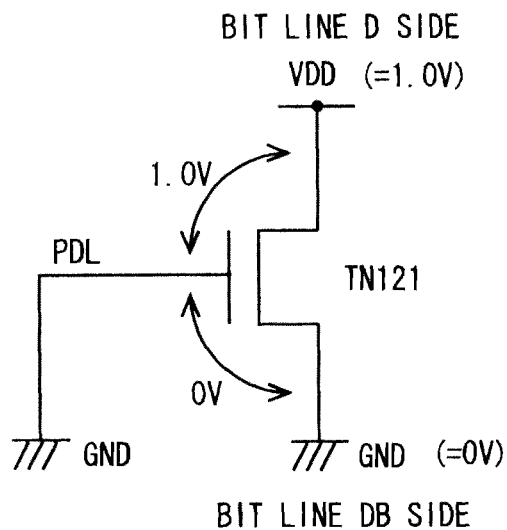
FIG. 4A is a schematic diagram showing a relationship between gate and drain voltages of a thin-film transistor constituting a precharge circuit according to the first exemplary embodiment.
Figure 4B:
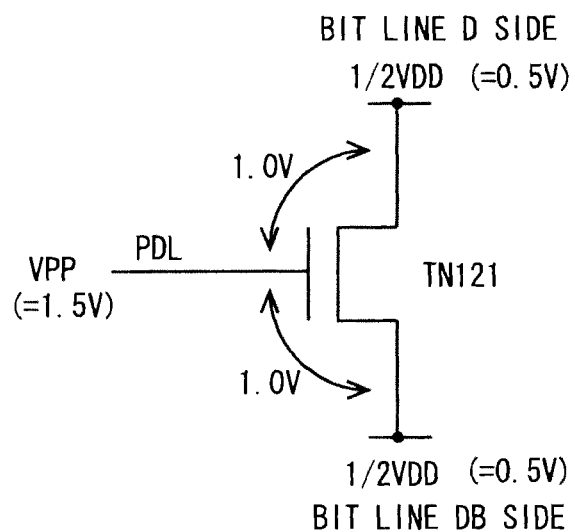
FIG. 4B is a schematic diagram showing a relationship between the gate and drain voltages of the thin-film transistor constituting the precharge circuit according to the first exemplary embodiment.

In this case, the voltage VPP whose potential is higher than that of the power supply voltage VDD is applied between the gate and drain (or source) of each of the NMOS transistors TN121, TN122, and TN123 which are thin-film transistors having a breakdown voltage as low as the power supply voltage VDD. Thus, breakdown may occur in the NMOS transistors TN121, TN122, and TN123. Referring now to the schematic diagrams of FIGS. 4A, 4B, 5A, and 5B, a relationship between gate and drain (or source) voltages of each of the NMOS transistors TN121, TN122, and TN123 will be described, for both cases of the high level and the low level of the precharge control signal PDL. FIGS. 4A and 4B each show an exemplary schematic diagram of the NMOS transistor TN121, and FIGS. 5A and 5B each show an exemplary schematic diagram of the NMOS transistor TN122.

Referring first to FIG. 4A, when the precharge control signal PDL is at low level, the ground voltage GND is applied to the precharge control line PDL. Note that the period in which the precharge control signal PDL is at low level corresponds to a period between the time t1 and the time t3 shown in FIG. 3. Thus, the power supply voltage VDD is applied as a maximum voltage to the bit line D, and the ground voltage GND is applied as a minimum voltage to the bit line DB. Accordingly, the gate-drain (or source) voltage of the NMOS transistor TN121 is about the power supply voltage VDD at a maximum.

Referring next to FIG. 4B, when the precharge control signal PDL is at high level, the voltage VPP is applied to the precharge control line PDL. Note that the period in which the precharge control signal PDL is at high level corresponds to a period after the time t4 shown in FIG. 3. At this time, the pair of bit lines D and DB are precharged to the voltage 1/2VDD. Thus, the voltage 1/2VDD is applied to the drain (or source) of the NMOS transistor TN121. Even when the voltage VPP is applied to the gate of the NMOS transistor TN121, only a small potential difference of (VPP−1/2VDD) is applied between the gate and drain (or source) thereof.

As seen from FIGS. 4A and 4B, when the power supply voltage VDD is 1.0 V and the voltage VPP is 1.5 V, for example, the voltage applied between the gate and drain (or source) of the NMOS transistor TN121 is about 1.0 V at a maximum. For this reason, even when a thin-film transistor having a breakdown voltage corresponding to about the power supply voltage VDD is used as the precharge circuit PDLU101, no dielectric breakdown occurs in the transistor. Additionally, as seen from FIG. 3, there is little overlap between the period in which the word signal WL101 is activated and the period in which the precharge control signal PDL is activated. Accordingly, there is no overlap between the period in which the charge peak current of the VPP power supply 110 occurs and the period in which the discharge peak current thereof occurs.

Figure 5A:
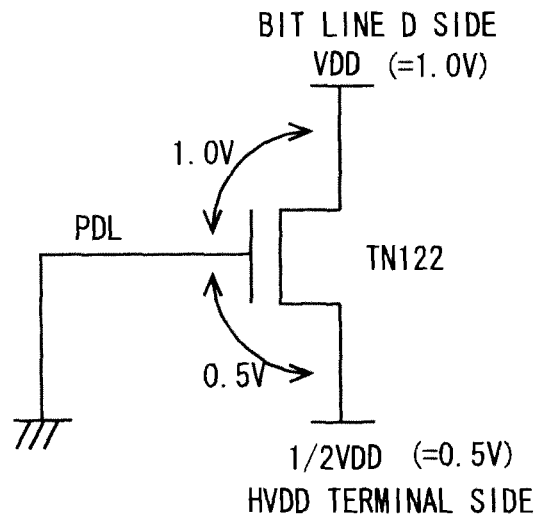
FIG. 5A is a schematic diagram showing a relationship between the gate and drain voltages of the thin-film transistor constituting the precharge circuit according to the first exemplary embodiment.

Referring further to FIG. 5A, when the precharge control signal PDL is at low level, the ground voltage GND is applied to the precharge control line PDL. Thus, the power supply voltage VDD is applied as a maximum voltage to the bit line D, and the voltage 1/2VDD is applied to the HVDD terminal. Accordingly, a voltage of about the power supply voltage VDD is applied between the gate and drain (or source) of the NMOS transistor TN122 at a maximum.

Figure 5B:
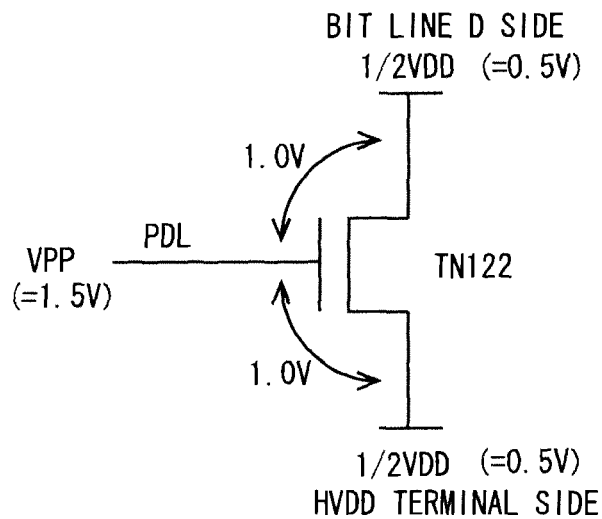
FIG. 5B is a schematic diagram showing a relationship between the gate and drain voltages of the thin-film transistor constituting the precharge circuit according to the first exemplary embodiment.

Referring to FIG. 5B, when the precharge control signal PDL is at high level, the voltage VPP is applied to the precharge control line PDL. At this time, the bit line D is precharged to the voltage 1/2VDD. Thus, the voltage 1/2VDD is applied to the drain (or source) of the NMOS transistor TN122. Even when the voltage VPP is applied to the gate of the NMOS transistor TN122, only a small potential difference of (VPP−1/2VDD) is applied between the gate and drain (or source) thereof.

As seen from FIGS. 5A and 5B, when the power supply voltage VDD is 1.0 V and the voltage VPP is 1.5 V, for example, the voltage applied between the gate and drain (or source) of the NMOS transistor TN122 is 1.0 V at a maximum. As with the NMOS transistor TN121 a thin-film transistor having a breakdown voltage corresponding to the power supply voltage VDD can be used as the NMOS transistor TN122. This is also applied to the NMOS transistor TN123.

In view of the foregoing, FIG. 6 shows a table illustrating relationships among the semiconductor memory circuit 1 according to the related art, the technique disclosed in Patent Document 1, and the semiconductor memory circuit 101 according to the first exemplary embodiment. First, in the semiconductor memory circuit 1 of the related art, the power supply voltage VDD is a high voltage (voltage higher than 1.0 V). The voltages VPP and VPDL are supplied from the VPP power supply 10 and the VPDL power supply 30 after the power supply voltage VDD is boosted. For this reason, thick-film transistors having a high breakdown voltage are used for all of the gate transistors of the memory cells, the transistors of the sense amplifier, and the transistor of the precharge circuit. If the transistor of the precharge circuit is the thick-film transistor, high-speed operation of the precharge circuit can be achieved by the boosted voltage VPDL. However, the use of the thick-film transistor does not contribute to a reduction in layout area. Accordingly, it is difficult to reduce the circuit size and achieve high-speed circuit operation.

If the miniaturization in fabrication process advances and the transistors of the sense amplifier SA101, which is required to have a breakdown voltage as low as about the reduced power supply voltage VDD, can be reduced in film thickness, it is difficult to further reduce the thickness of the gate oxide film of each transistor of the precharge circuit. This may cause a problem that the pitch of the precharge circuit PDLU101 cannot fall within the pitch of the sense amplifier SA101 in the near future.

Along with the miniaturization in fabrication process advances and the further reduction in the power supply voltage VDD (e.g., about 1.0 V), a thin-film transistor having a low breakdown voltage is to be used as a transistor constituting a semiconductor integrated device. In this regard, according to the technique disclosed in Patent Document 1, a thick-film transistor having a high breakdown voltage is used as the gate transistor of each memory cell, while a thin-film transistor having a low breakdown voltage, which is used for a logic circuit, is used as each of the transistors of the sense amplifier and the transistors of the precharge circuit. This solves the problem that the pitch of the sense amplifier cannot fall within the pitch of the precharge circuit as in the case of the semiconductor memory circuit 1. In the technique disclosed in Patent Document 1, however, it is impossible to apply a high voltage to the transistors of the precharge circuit, which limits the high-speed operation of the precharge circuit.

In view of this, in the semiconductor memory circuit 101 according to the first exemplary embodiment, the thin-film transistor having a breakdown voltage corresponding to about the reduced power supply voltage VDD is used as the transistor constituting the precharge circuit, and the voltage VPP for generating each word signal whose potential is higher than that of the power supply voltage VDD is also used as the precharge control signal PDL. The voltage VPP has been reduced by reducing the power supply voltage VDD. When the voltages VDD and VPP are equal to or lower than a certain level (for example, VDD is 1.0 V or lower and VPP is 1.5 V or lower), the thin-film transistor having a breakdown voltage corresponding to about the power supply voltage VDD can be used without causing any breakdown, as described above with reference to FIGS. 4A, 4B, 5A, and 5B. Therefore, the voltage VPP whose potential is higher than that of the power supply voltage VDD can be used as the precharge control signal PDL without causing any breakdown in the gate oxide film, and the operation speed of the precharge circuit can be increased.

Further, as shown in FIG. 2, the VPP power supply 110 supplies the voltage VPP from the terminal 130 to each of the driver amplifiers AMP101, AMP102, . . . , and the driver amplifier AMP 120. This eliminates the need to provide the VPDL power supply 30 and only the VPP power supply 110 is needed, unlike the semiconductor memory circuit 1, Therefore, in the semiconductor memory circuit 101, one power supply can be omitted, compared to the semiconductor memory circuit 1, which contributes to a reduction in circuit size.

Furthermore, in the semiconductor memory circuit 1, the VPP power supply 10 and the VPDL power supply 30 are separately provided. This makes it necessary to isolate power supply wiring networks from each other and to add a chip wiring layer. It is also necessary to provide a decoupling capacitor or the like for preventing a crosstalk between the wiring networks. Meanwhile, in the semiconductor memory circuit 101 according to the first exemplary embodiment, only the VPP power supply 110 is needed, and there is no need to provide double wiring layers and a decoupling capacitor, which contributes to a reduction in circuit size.

Moreover, as described above, there is no overlap between the period in which the charge peak current of the VPP power supply 110 occurs and the period in which the discharge peak current thereof occurs. Accordingly, there is no need to enhance the power supply voltage of the VPP power supply 110, and there is no factor of increasing the circuit size. This facilitates circuit design and achieves shortening of the time required for circuit design, a reduction in design errors, and a reduction in design cost, for example.

[Second Exemplary Embodiment]

A second exemplary embodiment of the present invention will be described in detail with reference to the drawings. In the second exemplary embodiment, the present invention is applied to a semiconductor integrated device such as a system LSI, as with the first exemplary embodiment. A semiconductor integrated device 200 according to the second exemplary embodiment differs from the semiconductor integrated device of the first exemplary embodiment in the configuration of a semiconductor memory circuit portion. Assuming that a semiconductor memory circuit according to the second exemplary embodiment is a semiconductor memory circuit 201, the semiconductor integrated device 200 of the second exemplary embodiment has a configuration in which the semiconductor memory circuit 101 of the semiconductor integrated device 100 shown in FIG. 1 is replaced with the semiconductor memory circuit 201.

The semiconductor integrated device 200 includes the semiconductor memory circuit 201 and the logic circuit 105. The semiconductor memory circuit 201 is a built-in DRAM of a system LSI, as with the first exemplary embodiment. The second exemplary embodiment assumes the case where transistors constituting the logic circuit 105 serving as a peripheral circuit of the semiconductor memory circuit 201 are further reduced in film thickness and the power supply voltage is also further reduced (e.g., VDD is 0.8 V or lower) as compared with the first exemplary embodiment.

Figure 7:
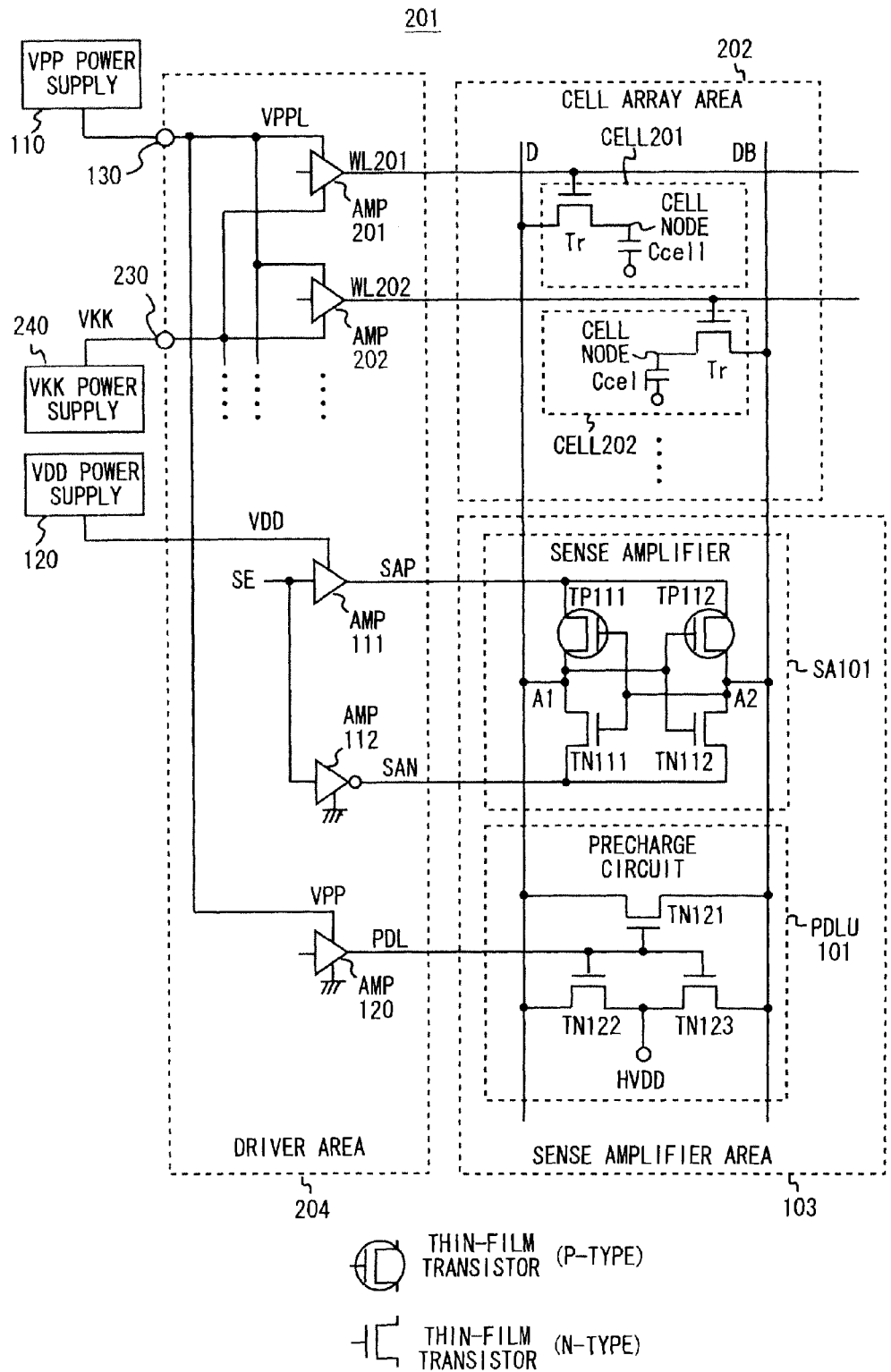
FIG. 7 shows a semiconductor memory circuit according to a second exemplary embodiment of the present invention.

FIG. 7 shows the configuration of the semiconductor memory circuit 201 according to the second exemplary embodiment. As shown in FIG. 7, the semiconductor memory circuit 201 includes a cell array area 202, the sense amplifier area 103, and a driver area 204. Note that reference symbols of FIG. 7 identical to those of FIG. 2 denote identical or similar elements. The second exemplary embodiment differs from the first exemplary embodiment in the configurations of the cell array area 202 and the driver area 204. In the second exemplary embodiment, the differences from the first exemplary embodiment will be mainly described, and the description of the other constituent elements similar to those of the first exemplary embodiment will be omitted.

The cell array area 202 includes multiple memory cells CELLs (CELL201, CELL202, . . . ). As with the first exemplary embodiment, each memory cell is connected to the pair of bit lines D and DB. Each memory cell includes the gate transistor Tr and the cell capacitor Cecil. Unlike the first exemplary embodiment, the gate transistor Tr of each memory cell of the second exemplary embodiment is formed of a thin-film transistor similar to that of the logic circuit 105. This makes it possible to reduce the circuit size of the cell array area 202. The other constituent elements are similar to those of the first exemplary embodiment.

The driver area 204 includes driver amplifiers AMP201, AMP202, . . . . The driver area 204 further includes the driver amplifiers AMP111, AMP112, and AMP120. The driver amplifiers AMP201, AMP202, . . . generate word signals WL201, WL202, . . . , respectively. In response to the word signals WL201, WL202, . . . , the gate transistors Tr of the memory cells CELL201, CELL202, . . . are activated. Unlike the first exemplary embodiment, the memory cells of the second exemplary embodiment use a voltage VPPL, which is supplied from the VPP power supply 110, as the high-potential-side power supply voltage of each of the driver amplifiers AMP201, AMP202, . . . , and use a voltage VKK, which is supplied from a VKK power supply 240, as the low-potential-side power supply voltage of each of the driver amplifiers AMP201, AMP202, . . . . Accordingly, the potential of a selected word signal (high level) becomes equal to the voltage VPPL and the potential of a non-selected word signal (low level) becomes equal to the voltage VKK.

As described above, the power supply voltage VDD is further reduced as compared with the first exemplary embodiment, so that the voltage VPP is also reduced. Further, the gate transistors Tr of the memory cells are each formed of a thin-film transistor, and the gate oxide film is further reduced in thickness as compared with the first exemplary embodiment. For this reason, the VPP power supply 110 supplies the voltage VPPL, which is lower than the voltage VPP of the first exemplary embodiment, in order to prevent a dielectric breakdown from occurring in the gate transistors Tr. When the power supply voltage VDD is 0.8 V, for example, the voltage VPPL may be about 1.2 V which is about 1.5 times as high as the power supply voltage VDD. In this case, a voltage higher than the power supply voltage VDD is applied to the gate transistors Tr formed of the thin-film transistors. Meanwhile, in the semiconductor memory circuit 201, the high-speed operation is achieved owing to the miniaturization, and the period of time for applying a high-level word signal to the gate transistor Tr of the selected memory cell is short. Further, it is extremely unlikely that the same memory cell is always selected from among the multiple memory cells CELL101, CELL102, . . . . Furthermore, the voltage VPPL is reduced to about 1.2 V. In view of this, the probability of occurrence of a dielectric breakdown is very low, even if the voltage VPPL higher than the power supply voltage VDD is applied to the gate transistor Tr of the thin-film transistor, and the use of the thinned gate transistor Tr as in the second exemplary embodiment poses no problem.

Meanwhile, the voltage VKK supplied from the VKK power supply 140 is a negative voltage lower than the ground voltage GND. Examples of the voltage VKK supplied from the VKK power supply 140 include a voltage of −0.3 V or lower. The voltage VKK is supplied to the low-potential-side power supply terminal of each of the driver amplifiers AMP201, AMP202, . . . through a terminal 230. Accordingly, the potential of the non-selected word line can be made negative. This makes it possible to further reduce the voltage VPPL supplied to the VPP power supply 110. For example, the voltage VPPL supplied from the VPP power supply 110 can be reduced to about 1.0 V. Therefore, the further reduction in film thickness of the gate transistor Tr of each memory cell in the cell array area 202 can be achieved. Moreover, the possibility of occurrence of a dielectric breakdown in the gate transistors Tr can be further reduced. Note that a back gate voltage of the gate transistor Tr may he made negative at the same time.

Figure 8:
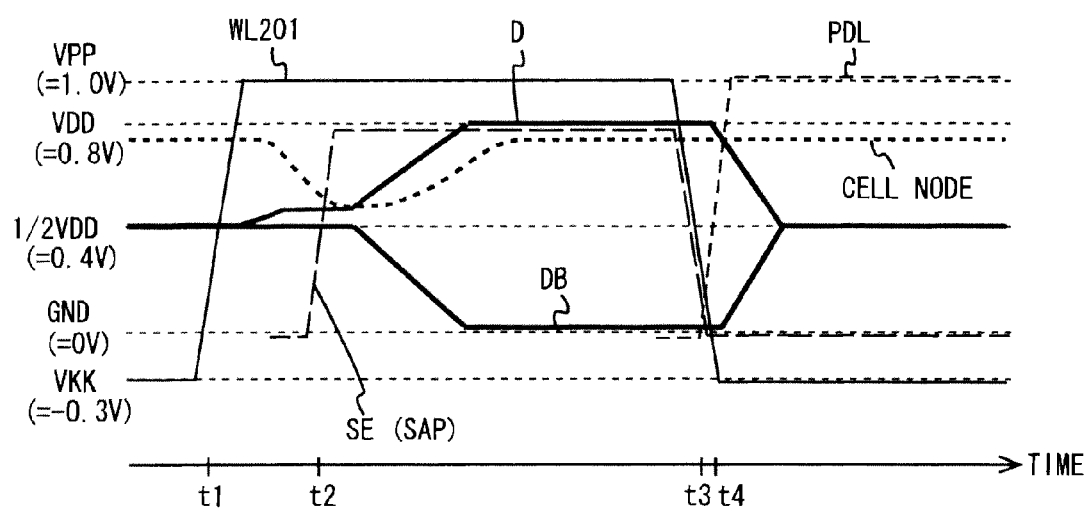
FIG. 8 is a timing diagram showing operation of the semiconductor memory circuit according to the second exemplary embodiment.

FIG. 8 shows a timing diagram showing operation of the semiconductor memory circuit 201. This exemplary embodiment illustrates the case where the memory cell CELL201 that holds high-level information is selected and the information is read out to the bit line D. It is assumed that prior to the time t1, the pair of bit lines D and DB are precharged to the voltage 1/2VDD. It is also assumed that the power supply voltage VDD is 0.8 V, the voltage VPPL is 1.0 V, and the voltage VKK is −0.3 V.

Referring to FIG. 8, at the time t1, the word signal WL201 rises to the voltage VPP from the voltage VKK. Accordingly, the gate transistor of the memory cell CELL201 is turned on, and the cell node and the bit line D are electrically connected to each other. The cell node holds high-level data, and electric charges are transferred to the bit line D. Thus, the potential of the cell node decreases, while the potential of the bit line D slightly increases.

Next, at the time t2, the control signal SE becomes high level. Accordingly, the sense amplifier control signal SAP becomes equal to the power supply voltage VDD, and the sense amplifier control signal SAN becomes equal to the ground voltage GND. Then, the sense amplifier SA101 starts sensing operation. The sense amplifier SA101 amplifies the small potential difference between the pair of bit lines D and DB to the power supply voltage VDD and to the ground voltage GND. Note that the amplifier potential difference between the pair of bit lines D and DB is read out as high-level readout data of the semiconductor memory circuit 201 by an external circuit, and is used for data processing and the like of the logic circuit 105. Additionally, the potential of the cell node of the memory cell CELL201 also increases.

After that, at the time t3, the word signal WL201 falls to the voltage VKK, and the control signal SE falls to the ground voltage GND. Accordingly, the gate transistor of the memory cell CELL201 is turned off, and the cell node of the memory cell CELL201 and the bit line D are electrically disconnected from each other. Further, the sense amplifier SA101 stops the sensing operation.

Then, at the time t4, the precharge control signal PDL rises to the voltage VPP from the ground voltage GND. Accordingly, the NMOS transistors TN121, TN122, and TN123 of the precharge circuit PDLU101 are turned on. Accordingly, the pair of bit lines D and DB are smoothed and charged to the voltage 1/2VDD, and are precharged again to the voltage 1/2VDD. The semiconductor memory circuit 201 operates in the manner as described above.

Figure 9A:
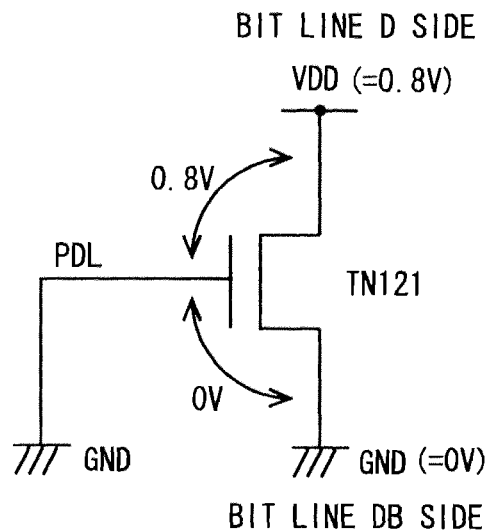
FIG. 9A is a schematic diagram showing a relationship between gate and drain voltages of a thin-film transistor constituting a precharge circuit according to the second exemplary embodiment.
Figure 9B:
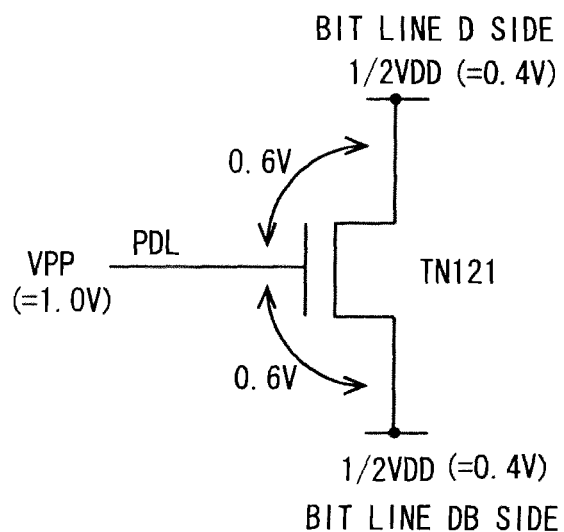
FIG. 9B is a schematic diagram showing a relationship between the gate and drain voltages of the thin-film transistor constituting the precharge circuit according to the second exemplary embodiment.
Figure 10A:
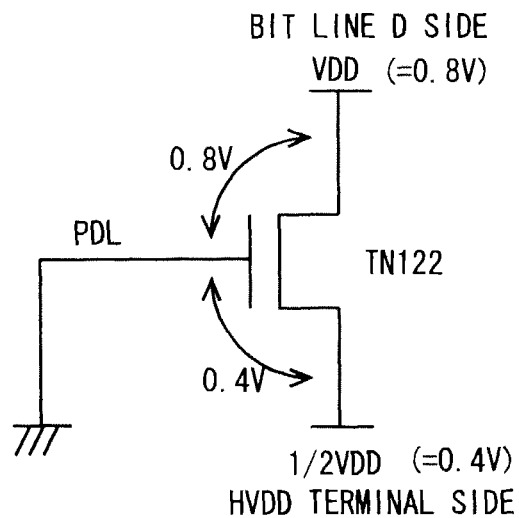
FIG. 10A is a schematic diagram showing a relationship between the gate and drain voltages of the thin-film transistor constituting the precharge circuit according to the second exemplary embodiment.
Figure 10B:
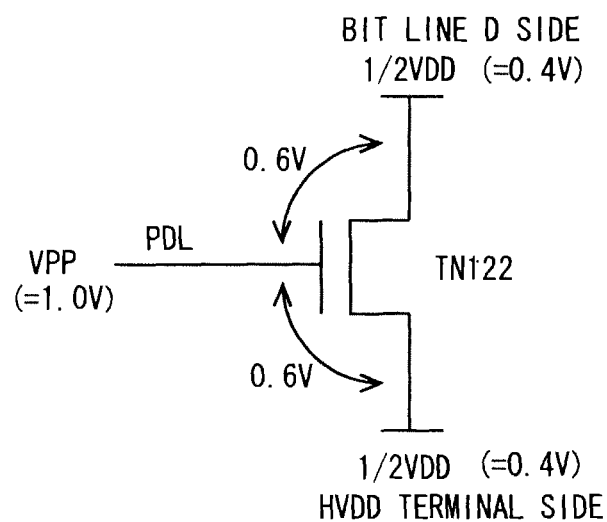
FIG. 10B is a schematic diagram showing a relationship between the gate and drain voltages of the thin-film transistor constituting the precharge circuit according to the second exemplary embodiment.
Figure 12:
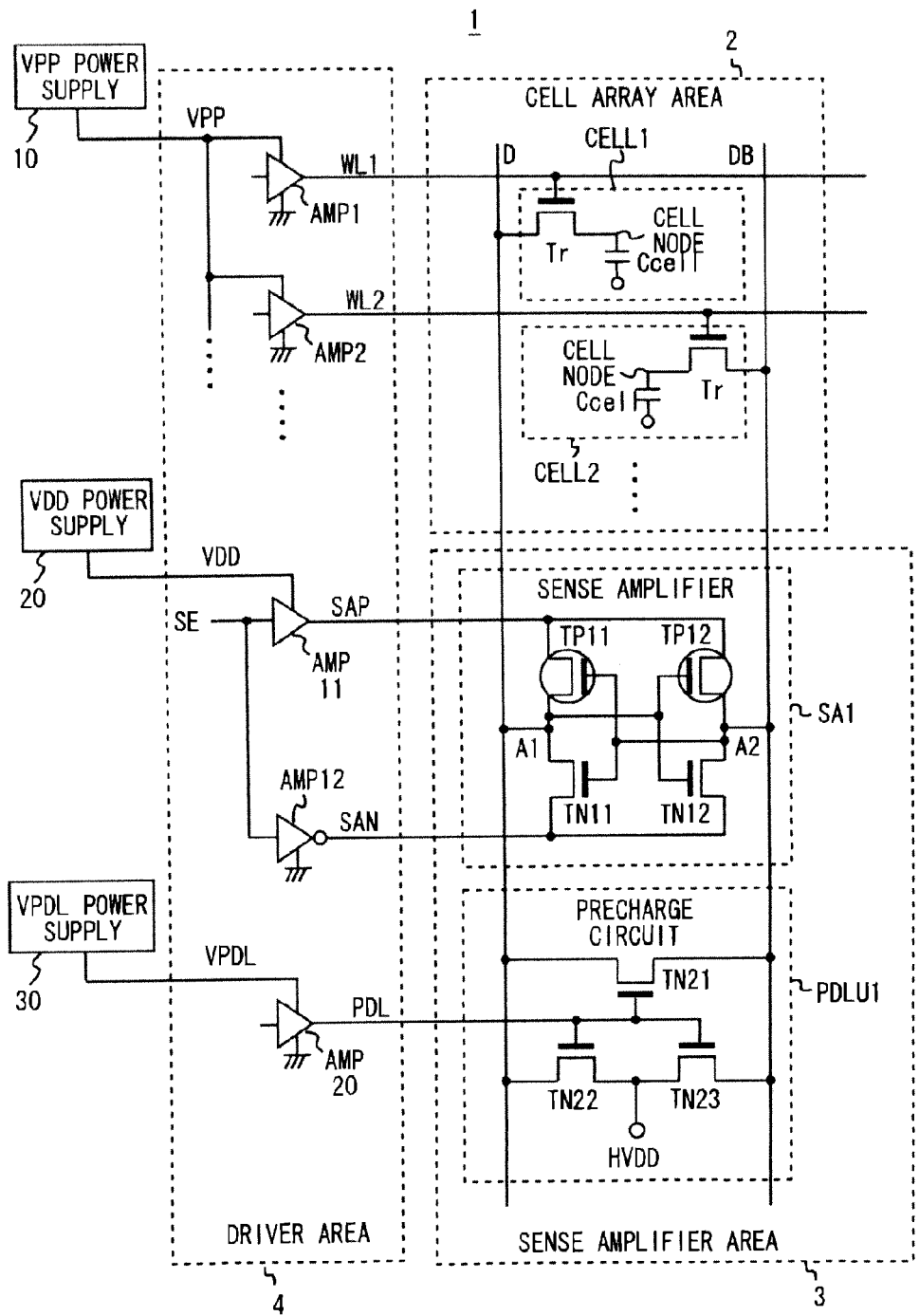
FIG. 12 shows a semiconductor memory circuit according to the related art.
Figure 13:
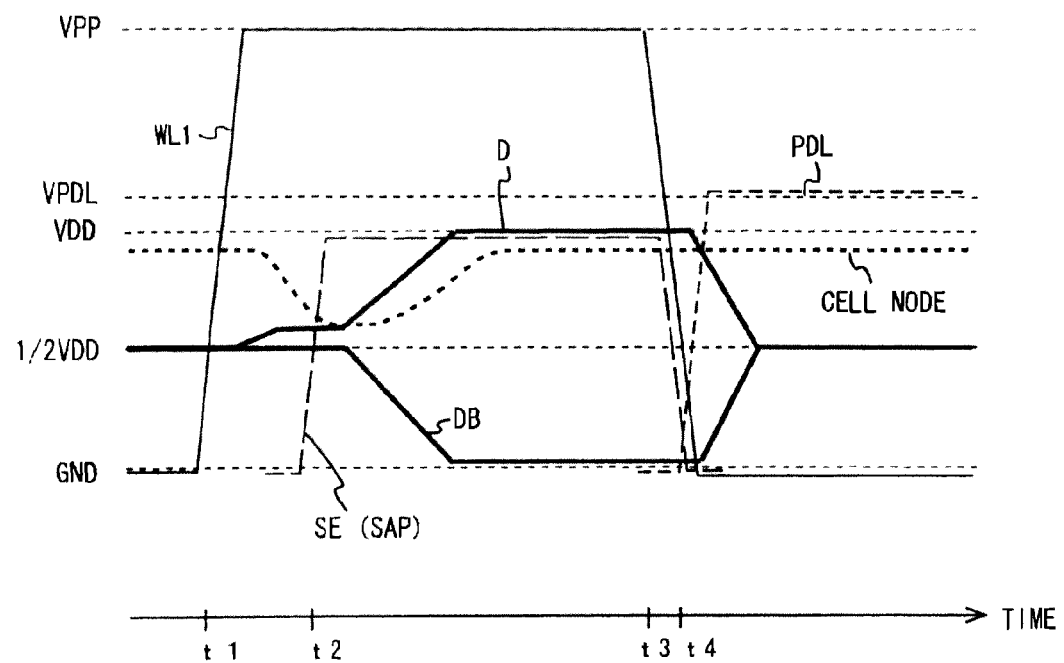
FIG. 13 is a timing diagram showing operation of the semiconductor memory circuit according to the related art.

FIGS. 9A and 10A are schematic diagrams each illustrating a relationship between gate and drain (or source) voltages of each of the NMOS transistors TN121, TN122, and TN123 when the precharge control signal PDL is at low level. FIGS. 9B and 10B are schematic diagrams each illustrating a relationship between gate and drain (or source) voltages of each of the NMOS transistors TN121, TN122, and TN123 when the precharge control signal PDL is at high level. As seen from these schematic diagrams, the gate-drain (or source) voltage of each of the NMOS transistors TN121, TN122, and TN123 is equal to or lower than the power supply voltage VDD at a maximum, as with the first exemplary embodiment. As seen from FIGS. 9B and 10B, the precharge voltage of the pair of bit lines is 1/2VDD (0.4 V) in this exemplary embodiment. Accordingly, the gate-drain (or source) voltage obtained when the precharge control signal PDL is at high level is 0.6 V. Thus, even when the precharge voltage is reduced to 0.2 V, the gate-drain (or source) voltage can be set to be equal to or lower than the power supply voltage VDD. Therefore, the precharge voltage of the pair of bit lines D and DB can also be set to be equal to or lower than 1/2VDD.

FIG. 11 shows a table illustrating relationships among the semiconductor memory circuit 1 according to the related art, the technique disclosed in Patent Document 1, the semiconductor memory circuit 101 according to the first exemplary embodiment, and the semiconductor memory circuit 201. In this table, the relationship with the semiconductor memory circuit 201 is added to the table shown in FIG. 6. Referring to FIG. 11, in the semiconductor memory circuit 201, thin-film transistors having a low breakdown voltage are used for all of the gate transistors of the memory cells, the transistors of the sense amplifier, and the transistors of the precharge circuit. The maximum voltage applied to the gates of the gate transistors Tr and the transistors of the precharge circuit is VPPL (<VPP).

As described above, in the semiconductor memory circuit 201 of the second exemplary embodiment, the gate transistors Tr of the memory cells, the transistors of the sense amplifier SA101, and the transistors of the precharge circuit PDLU101 are each formed of a thin-film transistor similar to that used for the logic circuit 105 which is miniaturized and has a reduced power supply voltage. This eliminates the need to form thick gate oxide films and thin gate oxide films of transistors separately in the fabrication process of an LSI chip, which simplifies the fabrication process. The simplification of the fabrication process leads to a reduction in manufacturing cost and time. Moreover, in the semiconductor memory circuit 201 according to the second exemplary embodiment, the word signals are made negative, for example, to reduce the voltage VPP. Also in this configuration, a thin-film transistor having a breakdown voltage corresponding to about the power supply voltage VDD can be used in the precharge circuit, and the voltage VPP used for the word signals can be used as the precharge control signal PDL, as with the first exemplary embodiment. In the second exemplary embodiment, the circuit size in the cell array area 202 can be reduced. Further, the supply voltage of the VPP power supply 110 can be further reduced and the gate oxide film of each transistor of the precharge circuit can be further reduced in thickness, thereby reducing the size of each transistor. Furthermore, the reduction in the power supply voltage leads to a reduction in power consumption. The other effects are similar to those of the first exemplary embodiment.

Note that the present invention is not limited to the above exemplary embodiments and can be modified in various manners without departing from the scope of the present invention. For example, a sense amplifier that is driven by a normal power supply voltage is used as the sense amplifier of the above exemplary embodiments, but the circuit configuration of the sense amplifier is not limited thereto. A variety of sense amplifiers can be applied. For example, a stepped-down power supply may be used as the power supply of the sense amplifier. Alternatively, an overdrive type sense amplifier may be employed in which a voltage higher than the stepped-down power supply (e.g., power supply voltage before being stepped down) is used only at the start of operation. Alternatively, another configuration may be employed in which a non-step-down power supply is used and a voltage slightly higher than the power supply voltage is used for only a very short period of time during an overdriving condition at the start of operation.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

The first and second exemplary embodiments can be combined as desirable by one of ordinary skill in the art.

What is claimed is:

1. A semiconductor integrated device comprising:
   a semiconductor memory circuit that includes a pair of bit lines and a precharge circuit coupled to said pair of bit line; and
   a peripheral circuit of the semiconductor memory circuit, wherein
   the peripheral circuit includes a first transistor controlled by first a voltage swing and having a first oxide film thickness, and wherein
   one of said pair of bit lines couples to a gate transistor of a memory cell, and wherein
   said precharge circuit includes a second transistor controlled by a second voltage swing
   larger than said first voltage swing, and said second transistor having said first oxide film thickness.

2. The semiconductor integrated device according to claim 1 further comprising
   a driver circuit that drives a word line of said memory circuit; wherein
   said driver circuit includes a transistor having a second oxide film thickness thicker than said first oxide film.

3. The semiconductor integrated device according to claim 2, wherein said driver circuit drives a negative voltage to said word line.

4. The semiconductor integrated device according to claim 1, further comprising
   a sense amplifier circuit that couples to said pair of bit lines; wherein
   said sense amplifier circuit includes a transistor having the first oxide film thickness.

5. The semiconductor integrated device according to claim 1, wherein
   a plurality of second transistors of said precharge circuit is arranged in a first area adjacent to a second area of said memory cell.

6. The semiconductor integrated device according to claim 5, wherein
   a plurality of sense amplifier circuits is arranged between said first area and said second area.

7. The semiconductor integrated device according to claim 5, wherein
   a plurality of driver circuits is arranged in a third area adjacent to both of said first area and said second area along a bitline direction.

* * * * *